(12) United States Patent
Ahn et al.

(10) Patent No.: US 9,953,769 B2
(45) Date of Patent: Apr. 24, 2018

(54) COMPOSITE ELECTRONIC COMPONENT AND BOARD HAVING THE SAME

(71) Applicant: SAMSUNG ELECTRO-MECHANICS CO., LTD., Suwon-Si, Gyeonggi-Do (KR)

(72) Inventors: Young Ghyu Ahn, Suwon-Si (KR); Sang Soo Park, Suwon-Si (KR); Byoung Hwa Lee, Suwon-Si (KR); Kyo Kwang Lee, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 205 days.

(21) Appl. No.: 14/811,463

(22) Filed: Jul. 28, 2015

(65) Prior Publication Data

US 2016/0027594 A1 Jan. 28, 2016

(30) Foreign Application Priority Data

Jul. 28, 2014 (KR) .................. 10-2014-0096007
Nov. 6, 2014 (KR) .................. 10-2014-0153910

(51) Int. Cl.
*H01G 15/00* (2013.01)
*H01G 2/06* (2006.01)
(Continued)

(52) U.S. Cl.
CPC ............ *H01G 15/00* (2013.01); *H01G 2/06* (2013.01); *H01G 4/012* (2013.01); *H01G 4/224* (2013.01);
(Continued)

(58) Field of Classification Search
CPC .......... H01G 15/00; H01G 2/06; H01G 9/08; H01G 4/38; H01G 4/224; H01G 4/30;
(Continued)

(56) References Cited

U.S. PATENT DOCUMENTS 7,352,563 B2 * 4/2008 Pelcak .................. H01G 9/012
361/329
8,044,760 B2 * 10/2011 Feichtinger ............ H01C 1/142
338/20
(Continued)

FOREIGN PATENT DOCUMENTS

JP 09-232196 A 9/1997
JP 09-326334 A 12/1997
(Continued)

*Primary Examiner* — Nathan Milakovich
(74) *Attorney, Agent, or Firm* — McDermott Will & Emery LLP

(57) ABSTRACT

A composite electronic component includes an insulation sheet, a tantalum capacitor including a body part containing a sintered tantalum powder and a tantalum wire, a portion of which is embedded in the body part, and disposed on the insulation sheet, a multilayer ceramic capacitor including a ceramic body including a plurality of dielectric layers, first and second internal electrodes, and first and second external electrodes, and disposed on the insulation sheet, and a molded portion enclosing the tantalum capacitor and the multilayer ceramic capacitor. The first internal electrode includes a first lead portion led out to upper and lower surfaces and a first end surface of the ceramic body in a length direction, and the second internal electrode includes a second lead portion led out to the upper and lower surfaces and a second end surface of the ceramic body in the length direction.

19 Claims, 10 Drawing Sheets

(51) Int. Cl.

| | |
|---|---|
| *H01G 4/12* | (2006.01) |
| *H01G 9/012* | (2006.01) |
| *H01G 4/224* | (2006.01) |
| *H01G 4/30* | (2006.01) |
| *H01G 4/012* | (2006.01) |
| *H01G 4/228* | (2006.01) |
| *H01G 4/38* | (2006.01) |
| *H01G 9/08* | (2006.01) |
| *H01G 9/28* | (2006.01) |
| *H05K 3/34* | (2006.01) |
| *H05K 1/18* | (2006.01) |

(52) U.S. Cl.
CPC ............ *H01G 4/228* (2013.01); *H01G 4/30* (2013.01); *H01G 4/38* (2013.01); *H01G 9/012* (2013.01); *H01G 9/08* (2013.01); *H01G 9/28* (2013.01); *H05K 3/3442* (2013.01); *H01G 4/12* (2013.01); *H05K 1/181* (2013.01); *H05K 2201/10015* (2013.01); *H05K 2201/2045* (2013.01); *Y02P 70/613* (2015.11)

(58) Field of Classification Search
CPC .......... H01G 4/12; H01G 9/012; H01G 4/012; H01G 4/228; H01G 9/28; H05K 3/3442; H05K 1/181
See application file for complete search history.

(56) References Cited

U.S. PATENT DOCUMENTS

| | | | | |
|---|---|---|---|---|
| 8,254,087 B2* | 8/2012 | Ibata | ...................... | H01G 9/012 361/528 |
| 8,411,417 B2* | 4/2013 | Kim | ...................... | H01G 9/008 361/523 |
| 8,540,783 B2* | 9/2013 | Ibata | ...................... | H01G 9/012 29/25.03 |
| 9,837,218 B2* | 12/2017 | Shin | ...................... | H01G 15/00 |
| 9,847,177 B2* | 12/2017 | Shin | ...................... | H01G 4/38 |
| 2010/0033904 A1* | 2/2010 | Niki | ...................... | H01G 9/28 361/523 |
| 2010/0149769 A1* | 6/2010 | Lee | ...................... | H01G 2/065 361/768 |
| 2011/0102969 A1* | 5/2011 | Togashi | ................. | H01G 4/012 361/306.3 |
| 2013/0229749 A1* | 9/2013 | Lee | ...................... | H01G 4/12 361/321.2 |
| 2013/0271894 A1* | 10/2013 | Biler | ...................... | H01G 9/052 361/528 |
| 2015/0014040 A1* | 1/2015 | Ahn | ...................... | H01G 4/30 174/260 |
| 2016/0020024 A1* | 1/2016 | Shin | ...................... | H01G 9/052 174/260 |
| 2016/0020031 A1* | 1/2016 | Shin | ...................... | H01G 4/38 174/260 |
| 2016/0020032 A1* | 1/2016 | Shin | ...................... | H01G 4/38 174/260 |
| 2016/0020033 A1* | 1/2016 | Shin | ...................... | H01G 4/38 174/260 |
| 2016/0020041 A1* | 1/2016 | Ahn | ...................... | H01G 4/232 363/21.01 |
| 2016/0027593 A1* | 1/2016 | Ahn | ...................... | H01G 4/38 361/301.4 |
| 2016/0172125 A1* | 6/2016 | Shin | ...................... | H01G 15/00 361/529 |
| 2017/0018373 A1* | 1/2017 | Son | ...................... | H05K 1/181 |
| 2017/0099727 A1* | 4/2017 | Son | ...................... | H05K 1/0231 |

FOREIGN PATENT DOCUMENTS

| | | |
|---|---|---|
| JP | 2008-108931 A | 5/2008 |
| KR | 10-2013-0101319 A | 9/2013 |

* cited by examiner

B-B'

COMPOSITE ELECTRONIC COMPONENT AND BOARD HAVING THE SAME

CROSS-REFERENCE TO RELATED APPLICATION

This application claims the priority and benefit of Korean Patent Application Nos. 10-2014-0096007 filed on Jul. 28, 2014 and 10-2014-0153910 filed on Nov. 6, 2014, with the Korean Intellectual Property Office, the disclosures of which are incorporated herein by reference.

BACKGROUND

The present disclosure relates to a composite electronic component including a plurality of passive elements and a board having the same.

A multilayer ceramic capacitor, a multilayer chip electronic component, may have a structure in which a plurality of dielectric layers and internal electrodes are alternately stacked, the internal electrodes having opposing polarities and being interposed between the dielectric layers.

Since the dielectric layers as described above may have piezoelectric and electrostrictive properties, when a direct current (DC) or alternating current (AC) voltage is applied to a multilayer ceramic capacitor, a piezoelectric phenomenon may occur in the dielectric layers interposed between the internal electrodes, causing vibrations.

Such vibrations may be transferred to a printed circuit board on which the multilayer ceramic capacitor is mounted through connective solders of the multilayer ceramic capacitor, such that the entire printed circuit board may act as an acoustic radiation surface to generate a vibration sound, commonly known as noise.

The vibration sound may have a frequency corresponding to an audio frequency in a region of 20 to 20000 Hz causing listener discomfort. The vibration sound causing listener discomfort as described above is known as acoustic noise.

In order to decrease the incidence of acoustic noise, research into a product in which a thickness of a lower cover layer of the multilayer ceramic capacitor is increased has been conducted.

However, research into a product having a greater effect in the reduction of acoustic noise has been further required.

RELATED ART DOCUMENT (Patent Document 1) Japanese Patent Laid-Open Publication No. 1997-326334

SUMMARY

An aspect of the present disclosure may provide a composite electronic component having a high degree of effectiveness in decreasing acoustic noise.

An aspect of the present disclosure may also provide a composite electronic component having low equivalent series resistance (ESR)/equivalent series inductance (ESL), improved DC-bias characteristics, and a reduced chip thickness.

According to an aspect of the present disclosure, a composite electronic component may include a composite body in which a multilayer ceramic capacitor and a tantalum capacitor are coupled to each other.

According to another aspect of the present disclosure, there is provided a composite electronic component of which, in an impedance vs. input signal frequency graph, an inflection point of impedance is generated in a frequency region lower than a self resonance frequency (SRF).

According to another aspect of the present disclosure, a composite electronic component may include a composite body including a multilayer ceramic capacitor and a tantalum capacitor, wherein internal electrodes of the multilayer ceramic capacitor include first and second internal electrodes, the first internal electrode being led out to upper and lower surfaces and a first end surface of a ceramic body and the second internal electrode being led out to the upper and lower surfaces and a second end surface of the ceramic body, such that equivalent series inductance (ESL) and equivalent series resistance (ESR) are decreased.

According to another aspect of the present disclosure, a board having a composite electronic component may include a printed circuit board on which electrode pads are formed, the composite electronic component as described above, mounted on the printed circuit board, and a solder connecting the electrode pads and the composite electronic component to each other.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
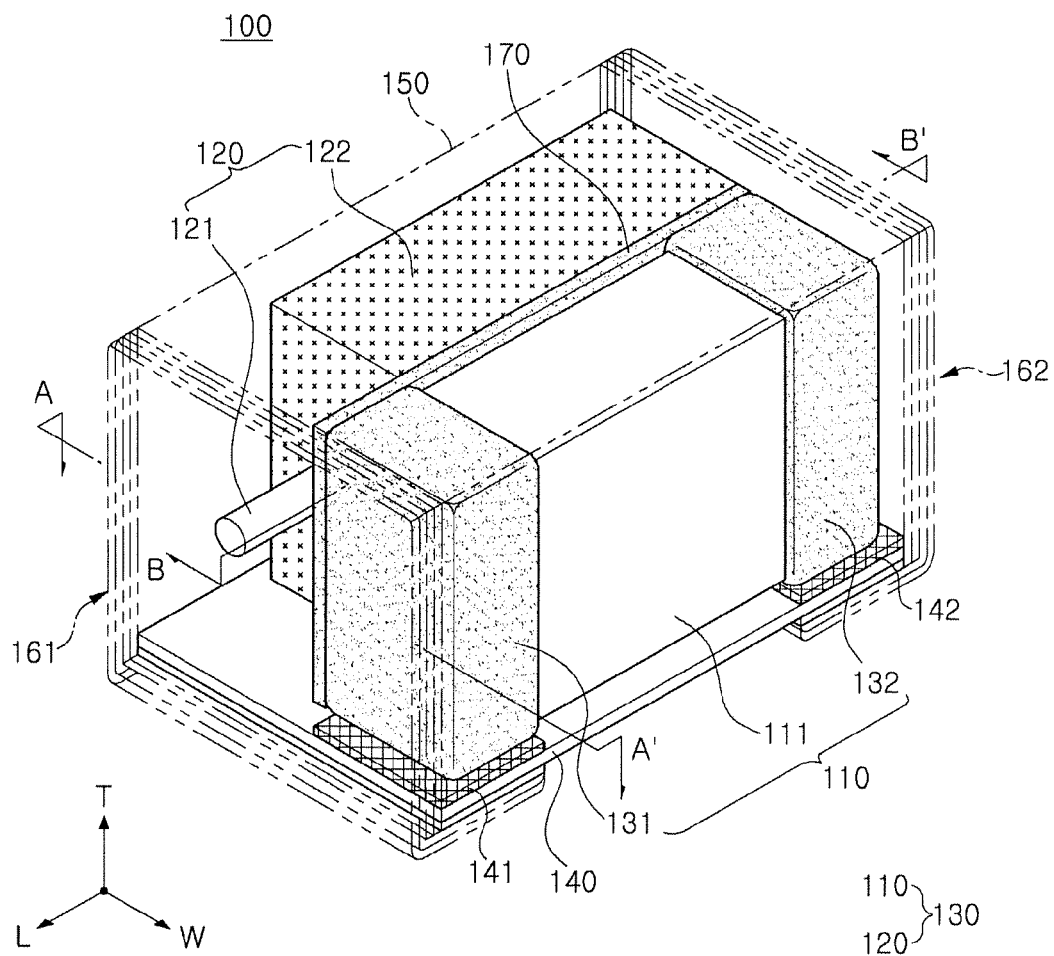
FIG. 1 is a perspective view illustrating terminal electrodes and a molded portion of a composite electronic component according to an exemplary embodiment in the present disclosure.

Hereinafter, embodiments in the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Directions of a hexahedron will be defined in order to allow exemplary embodiments of the present disclosure to be clearly described. L, W and T directions, depicted in the accompanying drawings, refer to a length direction, a width direction, and a thickness direction, respectively.

Composite Electronic Component

FIG. 1 is a perspective view illustrating terminal electrodes and a molded portion of a composite electronic component according to an exemplary embodiment in the present disclosure.

Referring to FIG. 1, a composite electronic component 100 according to an exemplary embodiment in the present disclosure may include an insulation sheet 140, a composite body 130 disposed on the insulation sheet 140 and including a multilayer ceramic capacitor 110 and a tantalum capacitor 120, a molded portion 150, and terminal electrodes 161 and 162.

The terminal electrodes (161 and 162) may include an anode terminal 161 and a cathode terminal 162.

According to the exemplary embodiment in the present disclosure, due to a structure of the composite electronic component including the composite body 130 in which the multilayer ceramic capacitor 110 and the tantalum capacitor 120 are coupled to each other, the composite electronic component may have a high degree of effectiveness in decreasing acoustic noise, implementing high capacitance, and may have low equivalent series resistance (ESR)/equivalent series inductance (ESL), improved DC-bias characteristics, and a reduced chip thickness.

The tantalum capacitor may implement high capacitance and have excellent DC-bias characteristics, and may not generate acoustic noise when mounted on a board.

On the contrary, a problem in which the tantalum capacitor has high equivalent series resistance (ESR) may occur.

Meanwhile, the multilayer ceramic capacitor may have relatively low equivalent series resistance (ESR) and equivalent series inductance (ESL), but DC-bias characteristics thereof may be low as compared to those of the tantalum capacitor, and it may be difficult to implement high capacitance.

In addition, at the time of mounting the multilayer ceramic capacitor on a board, acoustic noise may be generated.

However, since the composite electronic component 100 according to the exemplary embodiment in the present disclosure includes the composite body 130 in which the multilayer ceramic capacitor 110 and the tantalum capacitor 120 are coupled to each other, high equivalent series resistance (ESR), which is a disadvantage of the tantalum capacitor, may be decreased.

Further, deterioration of DC-bias characteristics, which is a disadvantage of the multilayer ceramic capacitor, may be decreased, and a chip thickness may be reduced.

In addition, according to the exemplary embodiment in the present disclosure, the multilayer ceramic capacitor which generates acoustic noise at the time of being mounted on a board and the tantalum capacitor which does not generate acoustic noise at the time of being mounted on a board are coupled to each other at a predetermined volume ratio, such that the effect of decreasing acoustic noise may be excellent.

Figure 2:
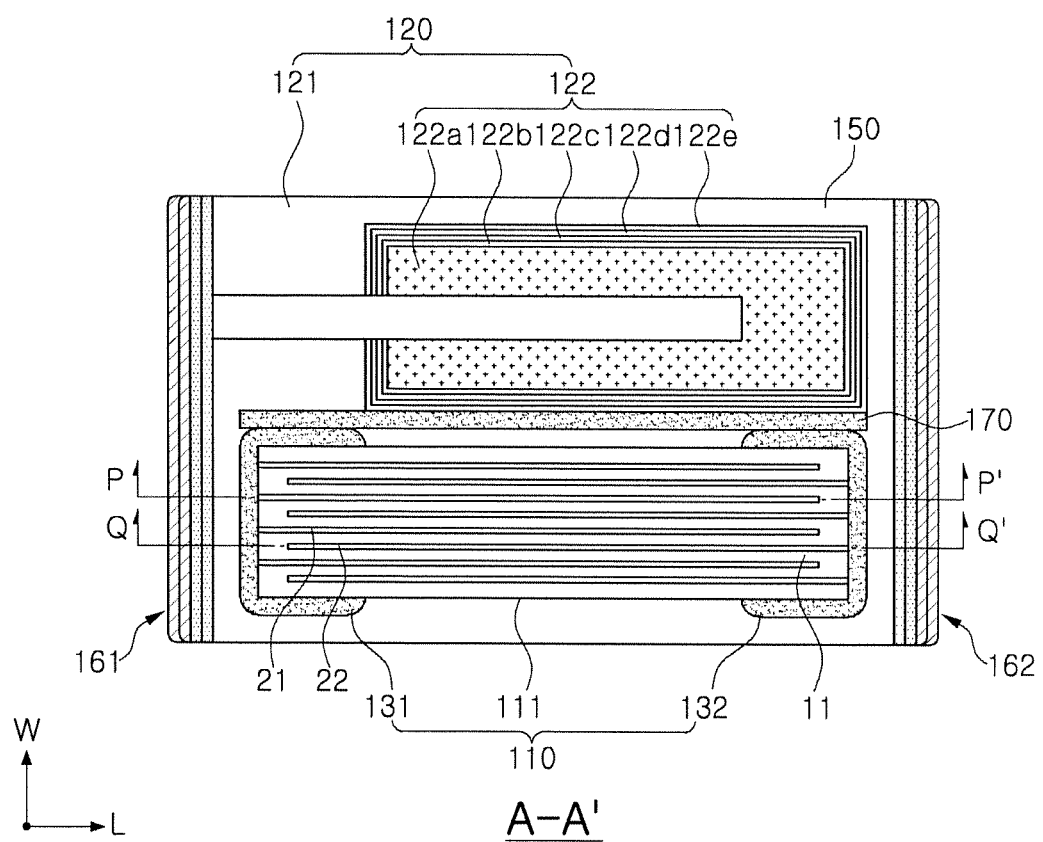
FIG. 2 is a cross-sectional view taken along line A-A' of FIG. 1.

FIG. 2 is a cross-sectional view taken along line A-A' of FIG. 1.

As illustrated in FIGS. 1 and 2, according to the exemplary embodiment in the present disclosure, the multilayer ceramic capacitor 110 may include a ceramic body 111 in which a plurality of dielectric layers 11 and internal electrodes 21 and 22 disposed with a respective dielectric layer interposed therebetween are stacked, and external electrodes 131 and 132 formed on external surfaces of the ceramic body so as to be connected to the internal electrodes.

The ceramic body 111 may have a substantially hexahedral shape having upper and lower surfaces opposing each other in the thickness direction, first and second end surfaces opposing each other in the length direction, and third and fourth side surfaces opposing each other in the width direction.

In the exemplary embodiment of the present disclosure, when the multilayer ceramic capacitor is disposed on the insulation sheet, the upper or lower surface of the ceramic body 111 may become a mounting surface adjacent to and facing the insulation sheet 140. Further, after the multilayer ceramic capacitor is disposed on the insulation sheet 140, the mounting surface adjacent to and facing the insulation sheet may become a lower surface, and a surface opposing the lower surface may become an upper surface.

The internal electrode may include first and second internal electrodes 21 and 22, and the first and second internal electrodes 21 and 22 may be alternately disposed on the dielectric layer 11 with a respective dielectric layer 11 interposed therebetween.

The ceramic body 111 may be formed by stacking the plurality of dielectric layers and the internal electrodes and then sintering the stacked dielectric layers and internal electrodes.

The dielectric layer 11 may contain a ceramic powder having high permittivity, for example, a barium titanate ($BaTiO_3$)-based powder or a strontium titanate ($SrTiO_3$)-based powder, or the like, but the dielectric layer 11 is not limited thereto.

The first and second internal electrodes 21 and 22 may be formed using a conductive paste formed of one or more of, for example, a noble metal such as palladium (Pd), a palladium-silver (Pd—Ag) alloy, or the like, nickel (Ni), and copper (Cu), but the first and second internal electrodes 21 and 22 are not limited thereto.

The external electrodes 131 and 132 may be disposed on the external surfaces of the ceramic body 111 to thereby be electrically connected to the internal electrodes. The external electrode may include first and second external electrodes 131 and 132. The first external electrode 131 may be electrically connected to the first internal electrode 21, and the second external electrode 132 may be electrically connected to the second internal electrode 22.

According to the exemplary embodiment in the present disclosure, a nickel/tin (Ni/Sn) plating layer may not be disposed on the first and second external electrodes 131 and 132, unlike a general multilayer ceramic capacitor.

Since the composite electronic component includes the molded portion 150 enclosing the composite body 130 including the multilayer ceramic capacitor 110 and the tantalum capacitor 120 disposed on an upper surface of the insulation sheet 140 as described below, there is no need to form a plating layer on the first and second external electrodes 131 and 132 of the multilayer ceramic capacitor 110.

Therefore, there is no problem such as a deterioration of reliability due to the infiltration of a plating solution into the ceramic body 111 of the multilayer ceramic capacitor 110.

As illustrated in FIG. 2, according to the exemplary embodiment in the present disclosure, the tantalum capacitor 120 may include a body part 122 and a tantalum wire 121. The tantalum wire 121 may be embedded in the body part 122 so that a portion of the tantalum wire 121 in the length direction is exposed to one surface of the body part.

The body part 122 of the tantalum capacitor may include an anode body 122a, a dielectric layer 122b, a solid electrolyte layer 122c, a carbon layer 122d, and a cathode layer 122e, but is not limited thereto.

The anode body 122a may be configured as a porous body containing a sintered tantalum powder.

The dielectric layer 122b may be formed on a surface of the anode body 122a. The dielectric layer 122b may be formed by oxidation of the surface of the anode body. For example, the dielectric layer 122b may be formed of a dielectric material containing tantalum oxide ($Ta_2O_5$), which is an oxide of tantalum forming the anode body, and may be formed on the surface of the anode body at a predetermined thickness.

The solid electrolyte layer 122c may be formed on a surface of the dielectric layer 122b. The solid electrolyte layer may contain one or more of a conductive polymer or manganese dioxide ($MnO_2$).

In the case in which the solid electrolyte layer 122c is formed of the conductive polymer, the solid electrolyte layer 122c may be formed on the surface of the dielectric layer by a chemical polymerization method or an electrolytic polymerization method. A conductive polymer raw material is not particularly limited as long as it has conductivity. For example, the conductive polymer raw material may contain polypyrrole, polythiophene, polyaniline, or the like.

In the case in which the solid electrolyte layer 122c is formed of manganese dioxide ($MnO_2$), conductive manganese dioxide may be formed on the surface of the dielectric layer by dipping the anode body having the dielectric layer formed on the surface thereof in a manganese aqueous solution such as a manganese nitrate solution, and pyrolyzing the manganese aqueous solution.

The carbon layer 122d containing carbon may be disposed on the solid electrolyte layer 122c.

The carbon layer 122d may be formed of a carbon paste. For example, the carbon layer 122d may be formed by applying the carbon paste dispersed in water or an organic solvent in a state in which a conductive carbon raw material powder such as natural graphite, carbon black, or the like, is mixed with a binder, a dispersant, or the like, to the solid electrolyte layer.

The cathode layer 122e containing a conductive metal may be disposed on the carbon layer 122d to improve electric connectivity with the cathode terminal, and the conductive metal contained in the cathode layer may be silver (Ag).

Although not particularly limited, for example, the tantalum capacitor may be connected to the external terminal in a structure in which an internal lead frame is not provided.

According to the exemplary embodiment in the present disclosure, the multilayer ceramic capacitor 110 and the tantalum capacitor 120 may be connected to each other in parallel.

According to the exemplary embodiment in the present disclosure, as illustrated in FIG. 2, the multilayer ceramic capacitor 110 and the tantalum capacitor 120 may be disposed on the insulation sheet 140.

The insulation sheet 140 is not particularly limited as long as it has insulation properties, and the insulation sheet 140 may be manufactured using an insulation material such as a ceramic-based material, or the like.

The molded portion 150 may be formed to cover the composite body 130 including the multilayer ceramic capacitor 110 and the tantalum capacitor 120, and the upper surface of the insulation sheet 140 on which the multilayer ceramic capacitor and the tantalum capacitor are disposed.

The molded portion 150 may serve to protect the multilayer ceramic capacitor 110 and the tantalum capacitor 120 from external environments, and may be mainly formed of an epoxy or silica-based mold compound (EMC), or the like, but the molded portion 150 is not limited thereto.

The composite electronic component according to the exemplary embodiment in the present disclosure may be implemented as a single component in which the multilayer ceramic capacitor 110 and the tantalum capacitor 120 are coupled to each other due to the molded portion 150.

An insulation layer 170 may be disposed between the multilayer ceramic capacitor 110 and the tantalum capacitor 120, and short-circuits of respective elements disposed in the composite electronic component may be prevented by the insulation layer 170.

Figure 3A:
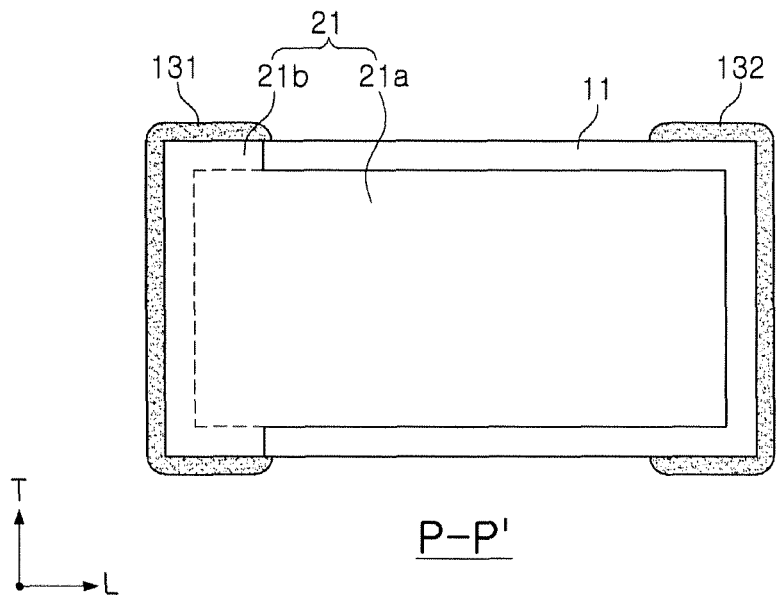
FIG. 3A is a cross-sectional view of a multilayer ceramic capacitor taken along line P-P' of FIG. 2.
Figure 3B:
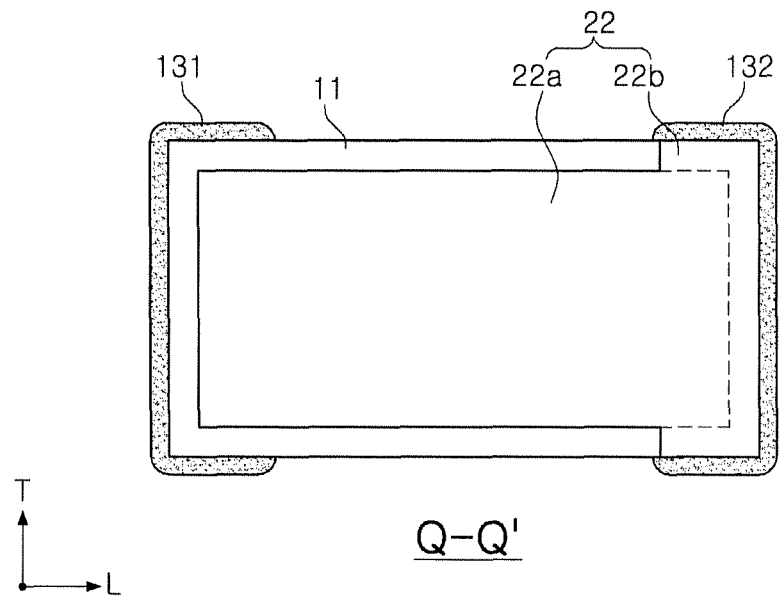
FIG. 3B is a cross-sectional view of the multilayer ceramic capacitor taken along line Q-Q' of FIG. 2.

FIG. 3A is a cross-sectional view of the multilayer ceramic capacitor 110 taken along line P-P' of FIG. 2, and FIG. 3B is a cross-sectional view of the multilayer ceramic capacitor 110 taken along line Q-Q' of FIG. 2.

As illustrated in FIGS. 3A and 3B, the internal electrode may include first and second internal electrodes 21 and 22, and the first and second internal electrodes 21 and 22 may be alternately disposed on the dielectric layers 11 with a respective dielectric layer 11 interposed therebetween.

According to the exemplary embodiment in the present disclosure, the first internal electrode 21 may include a first main portion 21a overlapping with the second internal electrode to form capacitance and a first lead portion 21b connected to the first main portion to thereby be led out to an external surface of the ceramic body, and the second internal electrode 22 may include a second main portion 22a overlapping with the first internal electrode to form capacitance and a second lead portion 22b connected to the second main portion to thereby be led out to another external surface of the ceramic body.

End portions of the first lead portion 21b may be led out to the upper and lower surfaces of the ceramic body and the first end surface thereof in the length direction, and end portions of the second lead portion 22b may be led out to the upper and lower surfaces of the ceramic body and the second end surface thereof in the length direction.

According to the exemplary embodiment in the present disclosure, since the first and second lead portions 21b and 22b are led out to the upper or the lower surface of the ceramic body, which may become the mounting surface, a size of a current loop formed in the multilayer ceramic capacitor may be decreased, such that equivalent series inductance (ESL) of the multilayer ceramic capacitor may be decreased.

According to the exemplary embodiment in the present disclosure, the first and second internal electrodes 21 and 22 may be disposed perpendicularly with respect to the upper or lower surface of the ceramic body. In addition, the first and second internal electrodes may be disposed perpendicularly with respect to the insulation sheet 140.

According to the exemplary embodiment in the present disclosure, the first and second internal electrodes 21 and 22 may be disposed perpendicularly with respect to aboard at the time of mounting the composite electronic component on the board.

According to the exemplary embodiment in the present disclosure, the width direction of the ceramic body 111 may be a direction in which the internal electrodes are stacked.

The external electrodes (131 and 132) may include the first external electrode 131 connected to the first internal electrodes 21 and the second external electrode 132 connected to the second internal electrodes 22.

The first external electrode 131 may be disposed on the first end surface of the ceramic body in the length direction and extended from the first end surface of the ceramic body to the upper and lower surfaces of the ceramic body so as to be connected to the first lead portions 21b exposed to the upper and lower surfaces of the ceramic body.

The second external electrode 132 may be disposed on the second end surface of the ceramic body opposing the first end surface thereof in the length direction and extended to the upper and lower surfaces of the ceramic body so as to be connected to the second lead portions 22b exposed to the upper and lower surfaces of the ceramic body.

In the case in which the lead portions of the first and second internal electrodes 21 and 22 are led out to the upper and lower surfaces of the ceramic body 111 and the first and second external electrodes 131 and 132 are extended from the first and second end surfaces of the ceramic body to the upper and lower surfaces of the ceramic body as in the exemplary embodiment in the present disclosure, equivalent series inductance (ESL) of the composite electronic component may be decreased.

For example, when the internal electrodes 21 and 22 of the multilayer ceramic capacitor are exposed to the mounting surface of the ceramic body 111 and a current is applied through the external electrodes 131 and 132 disposed on the mounting surface of the ceramic body as in the exemplary embodiment in the present disclosure, the size of the current loop formed in the multilayer ceramic capacitor may be decreased, such that equivalent series inductance (ESL) of the multilayer ceramic capacitor may be decreased, and thus, equivalent series inductance (ESL) of the composite electronic component may be decreased.

Further, when the first lead portion 21b is exposed to the upper and lower surfaces and the first end surface of the ceramic body and the second lead portion 22b is exposed to the upper and lower surfaces and the second end surface of the ceramic body as in the exemplary embodiment in the present disclosure, equivalent series resistance (ESR) of the multilayer ceramic capacitor may be decreased due to an increase in a contact area between the internal electrodes 21 and 22 and the external electrodes 131 and 132, and thus, equivalent series resistance (ESR) of the composite electronic component may be decreased.

Figure 4A:
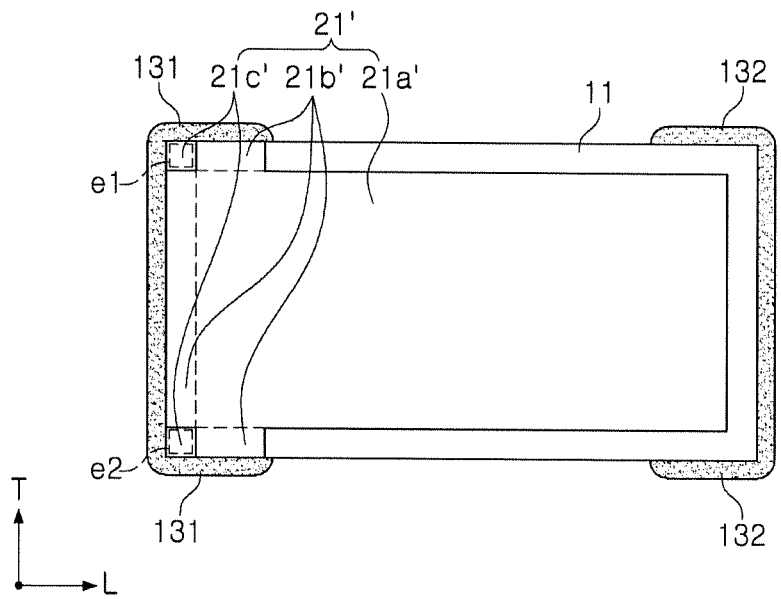
FIGS. 4A and 4B are cross-sectional views of a multilayer ceramic capacitor illustrating modified examples of first and second internal electrodes of the multilayer ceramic capacitor according to the exemplary embodiment in the present disclosure.
Figure 4B:
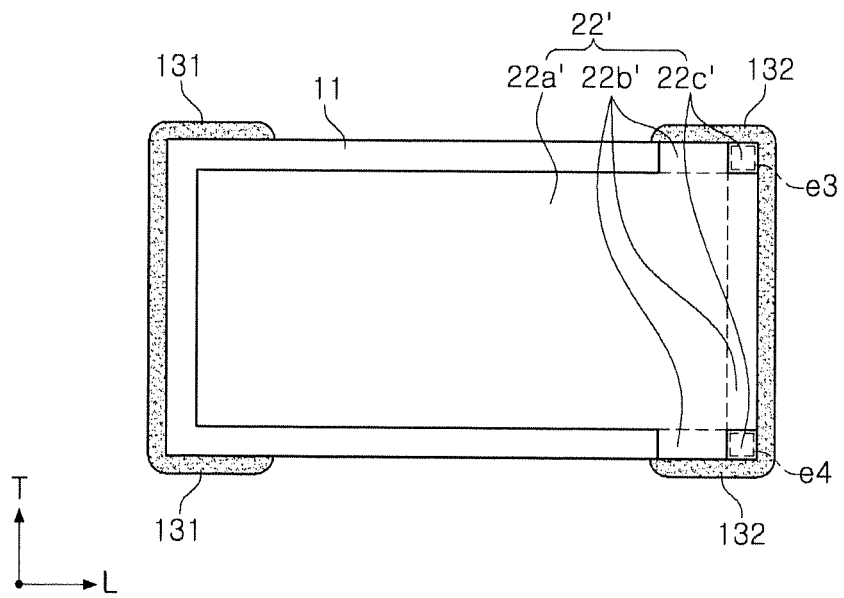

FIGS. 4A and 4B are cross-sectional views of a multilayer ceramic capacitor illustrating modified examples of first and second internal electrodes of the multilayer ceramic capacitor according to the exemplary embodiment in the present disclosure.

Referring to FIGS. 4A and 4B, first and second internal electrodes 21' and 22' of the multilayer ceramic capacitor according to the present modified example may include first and second main portions 21a' and 22a' and first and second lead portions 21b' and 22b', respectively. Here, the first lead portion 21b' may be led out to the upper and lower surfaces and the first end surface of the ceramic body 111, and the second lead portion 22b' may be led out to the upper and lower surfaces and the second end surface of the ceramic body 111.

According to the present modified example, the first internal electrode 21' may include a first non-pattern portion 21c' disposed on at least one or more of a first corner portion e1 adjacent to the upper surface of the ceramic body and the first end surface thereof in the length direction and a second corner portion e2 adjacent to the lower surface and the first end surface of the ceramic body, and the second internal electrode 22' may include a second non-pattern portion 22c' disposed on at least one or more of a third corner portion e3 adjacent to the upper surface of the ceramic body and the second end surface thereof in the length direction and a fourth corner portion e4 adjacent to the lower surface and the second end surface of the ceramic body.

The first and second non-pattern portions 21c' and 22c' may refer to portions of dielectric layers on which the first or second internal electrode is not formed.

Here, the first and second internal electrodes 21' and 22' may not be disposed on the first to fourth corner portions e1, e2, e3, and e4 of the ceramic body, respectively.

According to the present modified example, the first lead portion 21b' may not be led out to a region adjacent to a corner at which the upper and lower surfaces of the ceramic body and the first end surface thereof meet each other, and the second lead portion 22b' may not be led out to a region adjacent to a corner at which the upper and lower surfaces of the ceramic body and the second end surface thereof meet each other.

For example, when the first and second internal electrodes are printed on the dielectric layer, the first and second internal electrodes are not printed on corner portions of the dielectric layer, such that the first and second lead portions 21b' and 22b' may not be led out to the corner portions of the ceramic body.

The internal electrodes are not led out to the corner portions of the ceramic body as in the modified example of the present disclosure, such that portions of dielectric layers on which the internal electrode is not disposed may contact each other in the corner portions of the ceramic body, thereby preventing a delamination phenomenon in the ceramic body due to coupling force between the dielectric layers in the corner portions.

Further, according to the present modified example, equivalent series inductance (ESL) of the multilayer ceramic capacitor may be decreased, such that equivalent series inductance (ESL) of the composite electronic component may be decreased.

In addition, equivalent series resistance (ESR) of the multilayer ceramic capacitor may be decreased due to an increase in a contact area between the external electrodes and the internal electrodes, such that equivalent series resistance (ESR) of the composite electronic component may be decreased.

Figure 5:
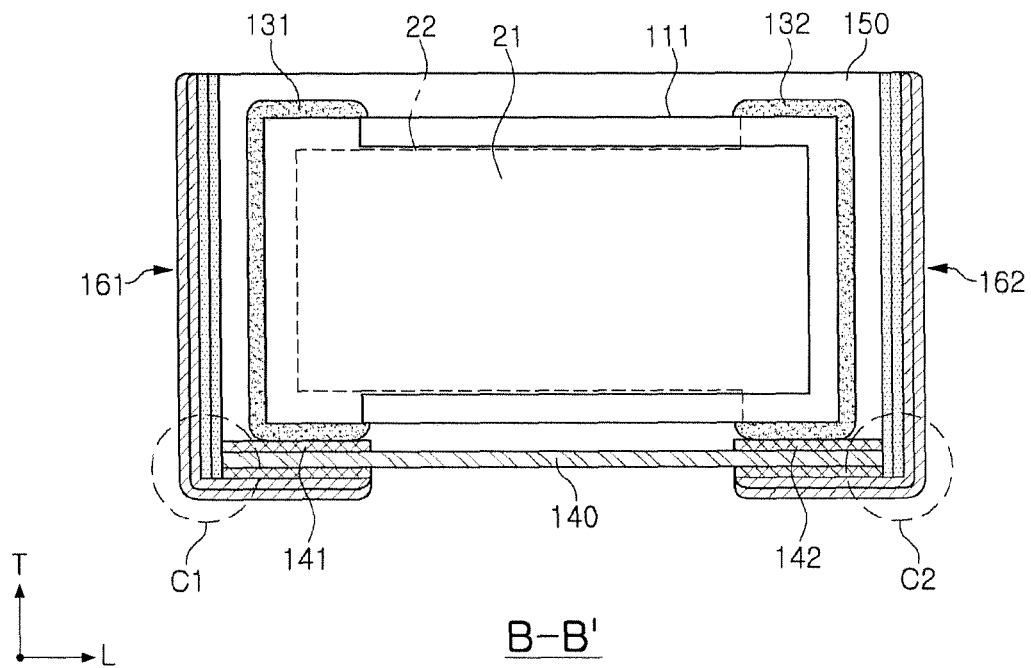
FIG. 5 is a cross-sectional view taken along line B-B' of FIG. 1.

FIG. 5 is a cross-sectional view taken along line B-B' of FIG. 1.

As illustrated in FIG. 5, according to the exemplary embodiment in the present disclosure, the composite electronic component 100 may include the anode and cathode terminals 161 and 162 electrically connected to the multilayer ceramic capacitor 110 and the tantalum capacitor 120.

According to the exemplary embodiment in the present disclosure, the tantalum wire 121 and the first external electrode 131 of the multilayer ceramic capacitor may be connected to the anode terminal 161, and the body part 122 of the tantalum capacitor and the second external electrode 132 of the multilayer ceramic capacitor may be connected to the cathode terminal 162.

The tantalum wire 121 may be exposed to a first end surface of the molded portion 150 in the length direction to thereby be connected to the anode terminal 161.

The tantalum capacitor 120 is a tantalum capacitor having a structure without an internal lead frame, and since the tantalum wire 121 may be exposed to the first end surface of the molded portion 150 in the length direction, a significantly increased amount of capacitance may be implemented as compared to a structure according to the related art.

As illustrated in FIG. 5, connective conductor parts 141 and 142 may be disposed on one or more of upper and lower surfaces of the insulation sheet 140.

The connective conductor parts 141 and 142 may contain a conductive material, and a shape thereof is not particularly limited as long as the connective conductor parts 141 and 142 may electrically connect the anode and cathode terminals 161 and 162 on outer portion of the molded portion and the composite body 130 in the molded portion to each other as described below.

According to the exemplary embodiment in the present disclosure, the anode terminal 161 and the first external electrode 131 may be connected to each other through the first connective conductor part 141, and the body part 122 and the second external electrode 132 may be connected to the cathode terminal 162 through the second connective conductor part 142.

The second connective conductor part 142 may be configured as a single element to connect all of the body part 122, the external electrode 132, and the cathode terminal 162 to one another. Alternatively, the second connective conductor part 142 may be configured as two or more elements so as to connect the body part 122 and the cathode terminal 162 to each other and connect the second external electrode 132 and the cathode terminal 162 to each other.

As illustrated in FIG. 5, the connective conductor parts 141 and 142 may have a metal pad shape, and thus may be provided as metal pads 141 and 142, but the connective conductor parts 141 and 142 are not limited thereto.

In addition, the metal pads 141 and 142 may contain copper (Cu), but are not limited thereto.

The metal pad may include a first metal pad 141 connected to the first external electrode 131 to thereby be exposed to one end surface of the molded portion 150 and a second metal pad 142 connected to the body part 122 and the second external electrode to thereby be exposed to the other end surface of the molded portion 150.

Figure 6:
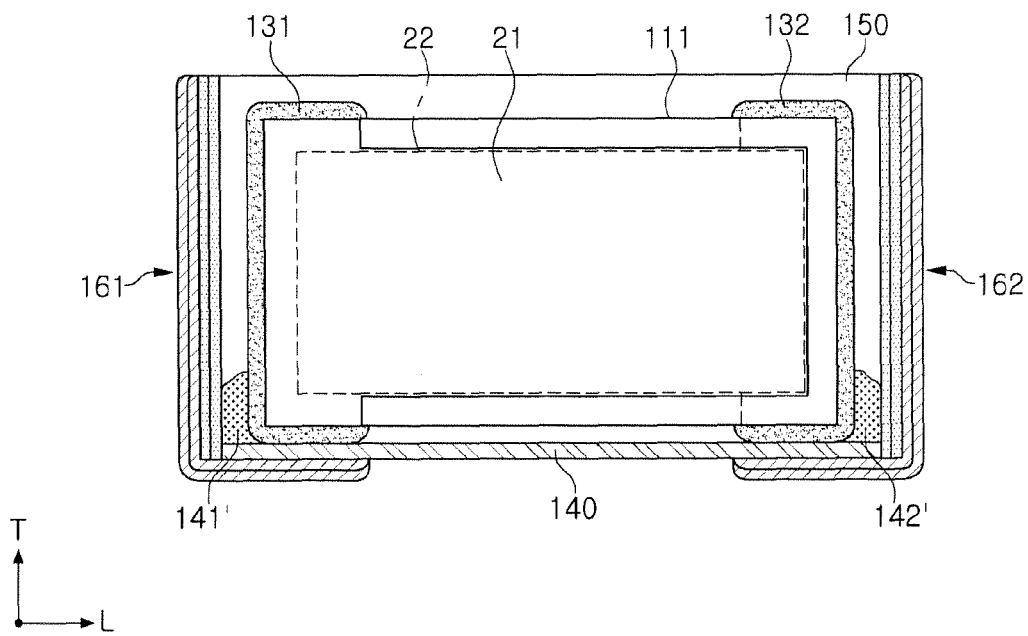
FIG. 6 is a cross-sectional view of a composite electronic component illustrating a modified example of a connective conductor part according to the exemplary embodiment in the present disclosure.

FIG. 6 is a cross-sectional view of a composite electronic component illustrating a modified example of the connective conductor part according to the exemplary embodiment in the present disclosure.

As illustrated in FIG. 6, connective conductor parts 141' and 142' may be provided as conductive resin parts formed by curing a conductive resin paste.

The conductive resin parts 141' and 142' may contain conductive particles and a base resin.

The conductive particles may be silver (Ag) particles but are not limited thereto, and the base resin may be a thermosetting resin, for example, an epoxy resin.

In addition, the conductive resin parts 141' and 142' may contain copper (Cu) as a conductive metal but are not limited thereto.

Further, although not illustrated, the connective conductor parts according to the exemplary embodiment in the present disclosure may include both the metal pad and the conductive resin part as described above.

Figure 7:
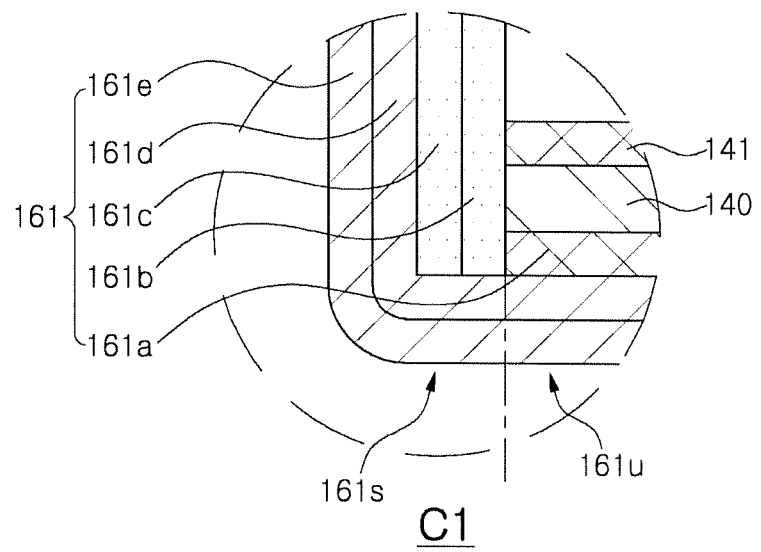
FIG. 7 is enlarged views of part C1 and part C2 of FIG. 5.
Figure 7:
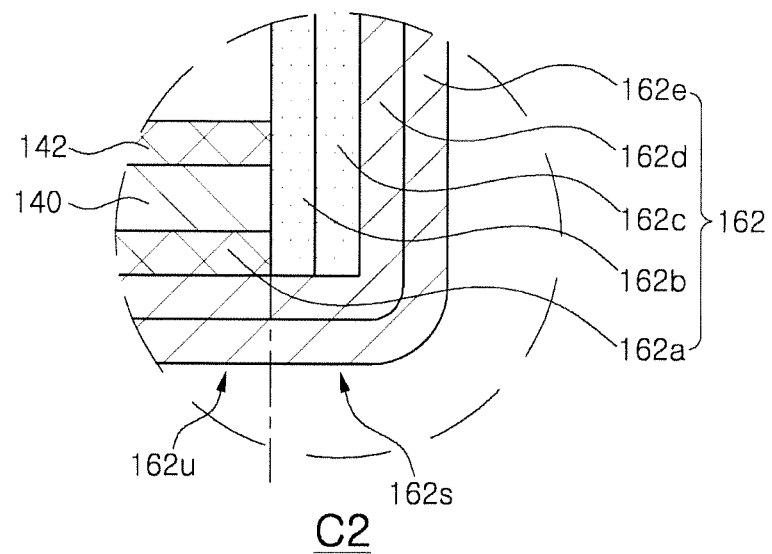

FIG. 7 is enlarged views of part C1 and part C2 of FIG. 5.

Referring to FIGS. 5 and 7, the terminal electrodes may include the anode terminal 161 and the cathode terminal 162.

The anode terminal 161 may be disposed on the first end surface of the molded portion 150 in the length direction and a lower surface of the insulation sheet and connected to the tantalum wire 121 and the first external electrode 131.

The cathode terminal 162 may be disposed on a second end surface of the molded portion 150 in the length direction and the lower surface of the insulation sheet and connected to the body part 122 and the second external electrode 132.

The anode terminal 161 and the first external electrode 131 may be connected to each other through the connective conductor part 141, and the cathode terminal 162 and the body part 122 may be connected to each other through the connective conductor part 142 distinguished from the connective conductor part 141.

According to the exemplary embodiment in the present disclosure, the anode terminal 161 may be extended from the first end surface of the molded portion 150 in the length direction to a portion of the lower surface of the insulation sheet 140, the cathode terminal 162 may be extended from the second end surface of the molded portion 150 in the length direction to a portion of the lower surface of the insulation sheet 140, and the anode terminal 161 and the cathode terminal 162 may be spaced apart from each other on the lower surface of the insulation sheet 140.

The anode terminal 161 may include an anode side terminal part 161s disposed on the end surface of the molded portion 150 and an anode lower terminal part 161u disposed on the lower surface of the insulation sheet 140, and the cathode terminal 162 may include a cathode side terminal part 162s disposed on the end surface of the molded portion 150 and a cathode lower terminal part 162u disposed on the lower surface of the insulation sheet 140.

According to the exemplary embodiment in the present disclosure, the anode terminal 161 may include a lower base layer 161a, side base layers 161b and 161c connected to the lower base layer 161a, and plating layers 161d and 161e enclosing the lower base layer 161a and the side base layers 161b and 161c.

Further, the cathode terminal 162 may include a lower base layer 162a, side base layers 162b and 162c connected to the lower base layer 162a, and plating layers 162d and 162e enclosing the lower base layer 162a and the side base layers 162b and 162c.

Although the lower base layers 161a and 162a are illustrated as single layers, respectively, and the side base layers 161b and 161c, and 162b and 162c are illustrated as two layers, respectively, in FIG. 7, the lower base layers and the side base layers are not limited thereto but may be disposed in various forms.

The anode and cathode terminals 161 and 162 may be formed by a process of dry-sputtering or plating at least one of Cr, Ti, Cu, Ni, Pd, and Au, or forming and etching a metal layer of at least one of Cr, Ti, Cu, Ni, Pd, and Au, but are not limited thereto.

In addition, the anode and cathode terminals 161 and 162 may be formed by a method of forming the lower base layers 161a and 162a and then forming the side base layers 161b, 161c, 162b, and 162c so as to be connected to the lower base layers 161a and 162a.

The lower base layers 161a and 162a may be formed by etching but are not limited thereto.

The lower base layers 161a and 162a may be disposed on the lower surface of the insulation sheet 140, and a pattern may be formed by performing an etching process for forming the lower base layers 161a and 162a after applying a metal thin film to the lower surface of the insulation sheet 140.

The lower base layers 161a and 162a may contain, for example, copper (Cu), but are not limited thereto.

In the case of forming the lower base layers 161a and 162a using copper (Cu), connectivity thereof with the side base layers 161b, 161c, 162b, and 162c formed using a separate process may be excellent, and electric conductivity thereof may also be excellent.

On the other hand, the side base layers 161b, 161c, 162b, and 162c may be formed by deposition, for example, a sputtering method.

The side base layers 161b, 161c, 162b, and 162c may be composed of two layers, for example, inner layers and outer layers, but are not limited thereto.

Among the side base layers 161b, 161c, 162b, and 162c, inner side base layers 161b and 162b may contain one or more of Cr or Ti to thereby be formed by a sputtering method, and be connected to the lower base layers 161a and 162a, respectively.

Among the side base layers 161b, 161c, 162b, and 162c, outer side base layers 161c and 162c may contain Cu and be formed by a sputtering method.

According to the exemplary embodiment in the present disclosure, the tantalum capacitor and the multilayer ceramic capacitor may be connected to each other in parallel on the insulation sheet 140 used to form anode and cathode terminals of a frame-less tantalum capacitor in which there is no internal lead frame.

According to the exemplary embodiment in the present disclosure, a composite electronic component in which impedance of a tantalum capacitor is exhibited in a low frequency section and impedance of a multilayer ceramic capacitor is exhibited in a high frequency section may be provided.

Figure 8A:
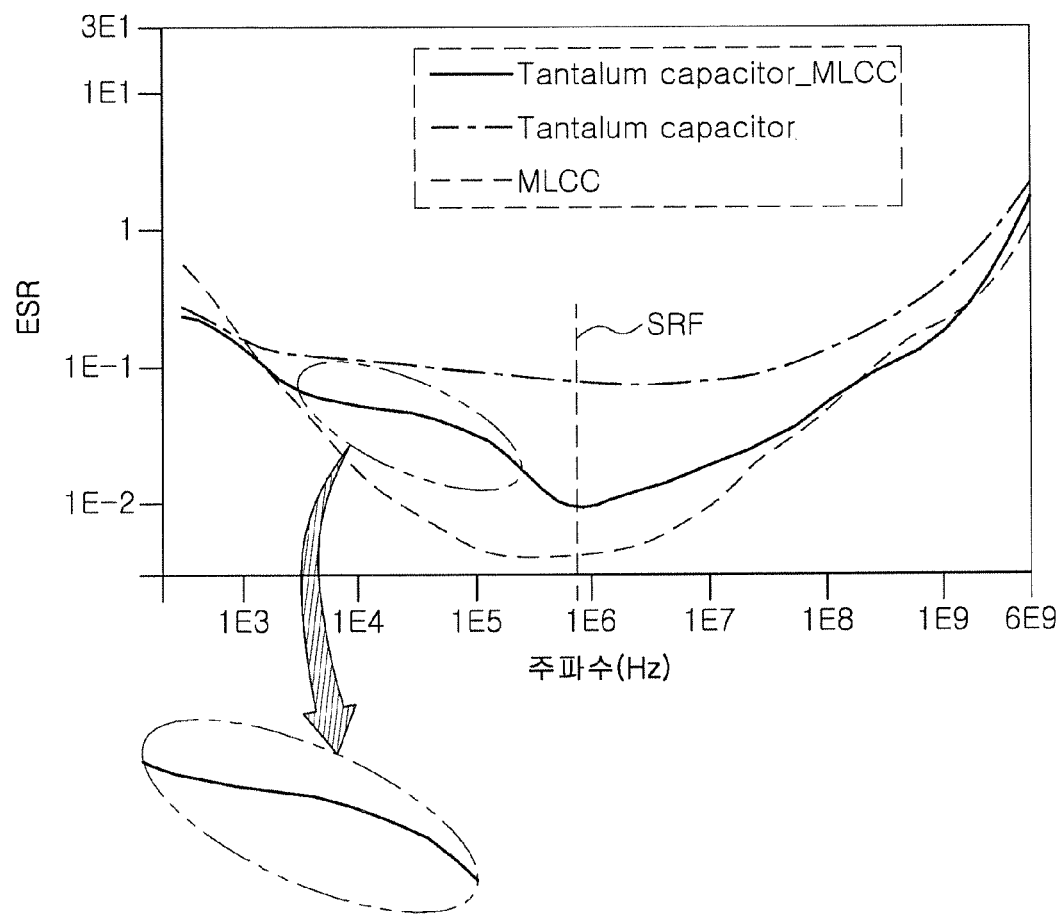
FIGS. 8A and 8B are graphs illustrating equivalent series resistance (ESR) and impedance vs. frequency of composite electronic components according to the exemplary embodiment in the present disclosure and other comparative Example.
Figure 8B:
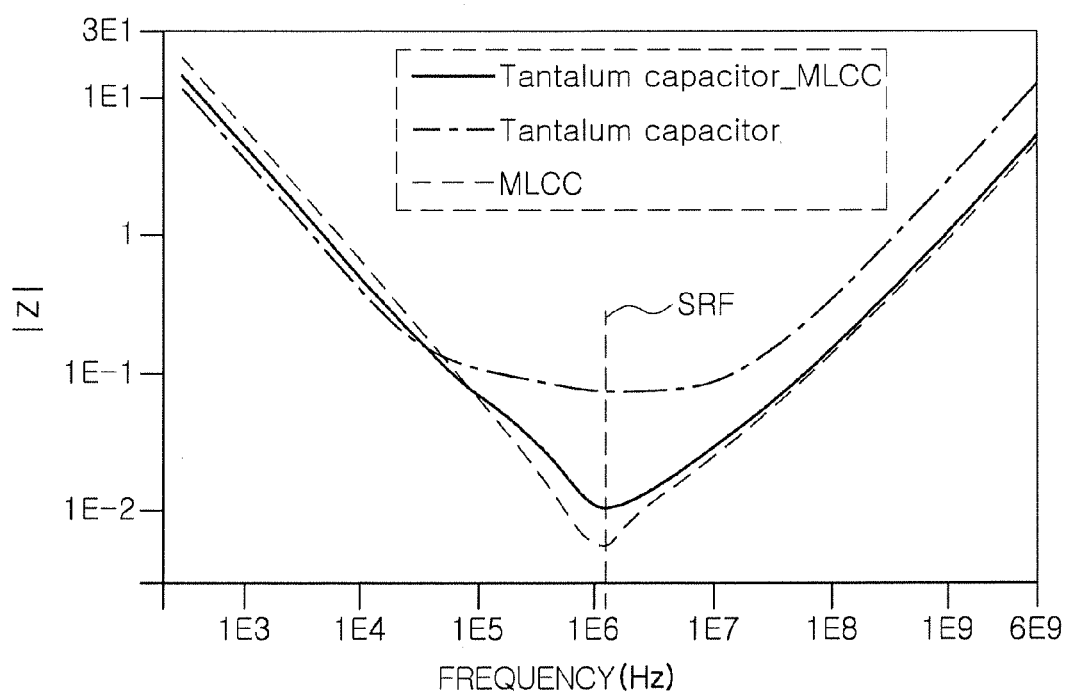

FIGS. 8A and 8B are graphs indicating equivalent series resistance (ESR) and impedance vs. frequency of the composite electronic components according to the exemplary embodiment in the present disclosure and other comparative Example.

Referring to FIGS. 8A and 8B, in the case of the composite electronic component according to the exemplary embodiment in the present disclosure, inflection points of equivalent series resistance (ESR) and impedance are generated in at least one region of frequency regions lower or higher than a self resonant frequency (SRF) in equivalent series resistance (ESR) and impedance vs. input signal frequency graphs.

For example, according to the exemplary embodiment in the present disclosure, in the impedance vs. frequency graph, impedance of the tantalum capacitor was exhibited in a low frequency region, and impedance of the multilayer ceramic capacitor was exhibited in a high frequency region.

Therefore, with reference to the equivalent series resistance (ESR) and impedance vs. input signal frequency graphs, the inflection points of the equivalent series resistance (ESR) and impedance are generated in at least one frequency region having a level lower or higher than the self resonant frequency (SRF).

The inflection points of the equivalent series resistance (ESR) and impedance may be generated in at least one frequency region having a level lower or higher than the self resonant frequency (SRF) or both of the frequency regions lower and higher than the self resonant frequency (SRF).

Since the inflection points of the equivalent series resistance (ESR) and impedance are generated in at least one frequency region having a level lower or higher than the self resonant frequency (SRF), in the composite electronic component according to the exemplary embodiment in the present disclosure, relatively low equivalent series resistance may be implemented.

Figure 9:
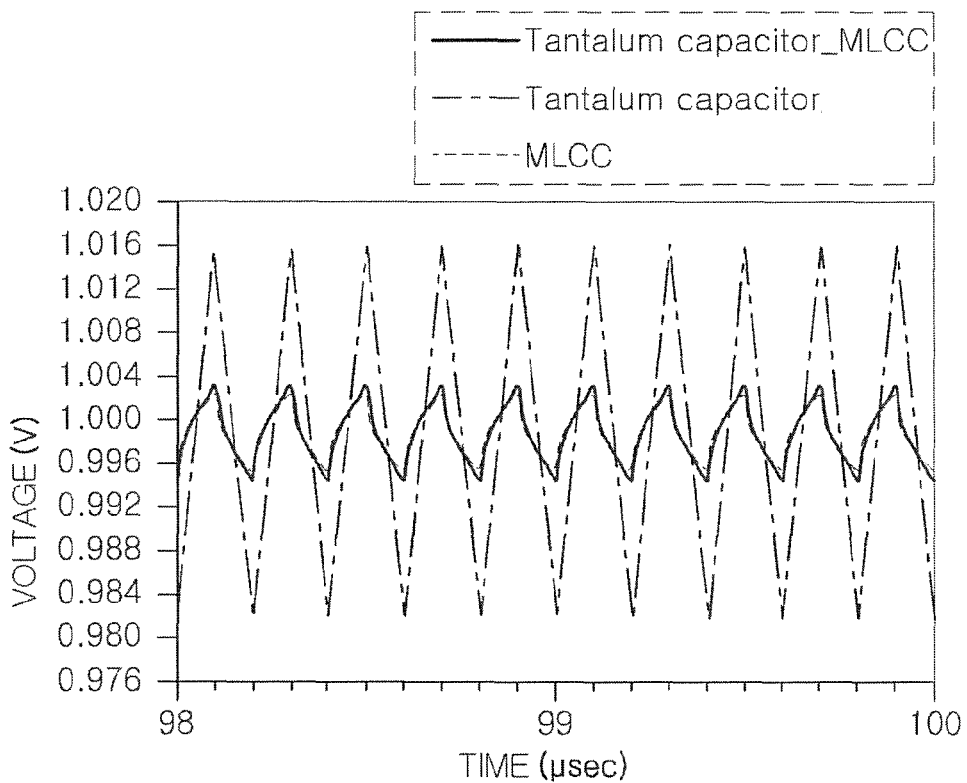
FIG. 9 is a graph illustrating an output voltage vs. time, according to Embodiment of the present disclosure and Comparative Example.

FIG. 9 is a graph illustrating an output voltage vs. time, according to the Embodiments of the present disclosure and the Comparative Examples.

Referring to FIG. 9, it may be appreciated that in the case of the Embodiments in the present disclosure, voltage ripple was significantly decreased as compared to the Comparative Examples using only a tantalum capacitor, and the voltage ripple was almost similar to that in Comparative Example using only a multilayer ceramic capacitor.

For example, it may be appreciated that in the case of a Comparative Example using only the tantalum capacitor, the voltage ripple was 34 mV, but in the case of Embodiment according to the present disclosure, the voltage ripple was decreased to 9 mV so as to be similar to the voltage ripple (7 mV) in a Comparative Example using only the multilayer ceramic capacitor.

The following Table 1 illustrates capacitance, equivalent series resistance (ESR), equivalent series inductance (ESL), and acoustic noise characteristics depending on a volume ratio of a tantalum capacitor and a multilayer ceramic capacitor (a volume of the tantalum capacitor: a volume of the multilayer ceramic capacitor) in the composite electronic component according to the exemplary embodiment in the present disclosure.

TABLE 1

| Sample | Volume Ratio of Tantalum Capacitor and Multilayer Ceramic Capacitor (T:M) | Capacitance (μF) | ESR (mΩ) | ESL (pH) | Acoustic Noise (dBA) |
|---|---|---|---|---|---|
| 1* | 10:0 | 45.0 | 150 | 471 | 16.6 |
| 2* | 9.5:0.5 | 44.9 | 58 | 415 | 16.6 |
| 3 | 9:1 | 44.7 | 26 | 369 | 16.7 |
| 4 | 8:2 | 44.4 | 21 | 313 | 16.7 |
| 5 | 7:3 | 44.1 | 16 | 281 | 16.8 |
| 6 | 6:4 | 43.8 | 11 | 258 | 16.9 |
| 7 | 5:5 | 43.5 | 9.2 | 240 | 16.9 |
| 8 | 4:6 | 43.2 | 7.1 | 225 | 17.3 |
| 9 | 3:7 | 42.9 | 6.4 | 213 | 17.5 |
| 10 | 2:8 | 42.6 | 5.5 | 203 | 18.1 |
| 11* | 1:9 | 42.3 | 4.1 | 197 | 26.5 |
| 12* | 0:10 | 42.0 | 3.3 | 207 | 28.2 |

*Comparative Example

Referring to Table 1, it may be appreciated that in samples 1 and 2 corresponding to cases in which the volume ratio of the tantalum capacitor and the multilayer ceramic capacitor coupled to each other in the composite electronic component was more than 9:1, equivalent series resistance (ESR) was increased.

In the case of a capacitor used in a power supply terminal, when an equivalent series resistance (ESR) value is more than 30 mΩ, voltage ripple and radiation noise may be increased, and power efficiency may be deteriorated.

It may be confirmed that in samples 11 and 12 corresponding to the cases in which the volume ratio of the tantalum capacitor and the multilayer ceramic capacitor coupled to each other in the composite electronic component was less than 2:8, an effect of decreasing acoustic noise was insignificant.

In samples 3 to 10 of the Embodiments in the present disclosure, corresponding to the cases in which the volume ratio of the tantalum capacitor and the multilayer ceramic capacitor coupled to each other was 9:1 to 2:8 (tantalum capacitor:multilayer ceramic capacitor), composite electronic components having a relatively low equivalent series resistance (ESR) value and a relatively high degree of effectiveness in decreasing acoustic noise may be implemented.

Figure 10:
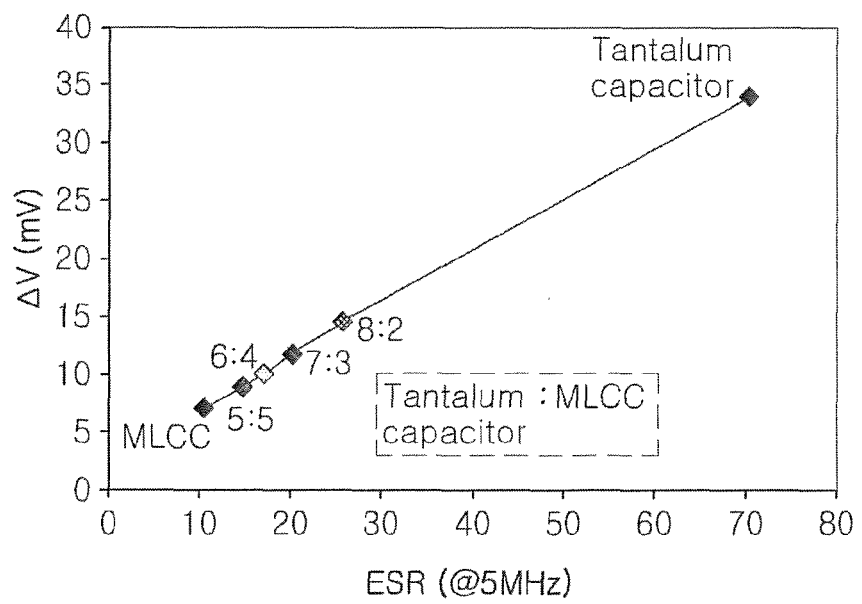
FIG. 10 is a graph illustrating voltage ripple ($\Delta V$) vs. ESR depending on a volume ratio of a multilayer ceramic capacitor and a tantalum capacitor in the composite electronic component according to the exemplary embodiment in the present disclosure.

FIG. 10 is a graph illustrating voltage ripple (ΔV) vs. ESR depending on a volume ratio of a multilayer ceramic capacitor and a tantalum capacitor in the composite electronic component according to the exemplary embodiment in the present disclosure.

Referring to FIG. 10, it may be appreciated that although not limited thereto, when the volume ratio of the tantalum capacitor and the multilayer ceramic capacitor coupled to each other in the composite electronic component according to the exemplary embodiment in the present disclosure is 5:5 to 7:3, an electronic component having low equivalent series resistance (ESR) and voltage ripple (ΔV) values and high capacitance may be implemented.

Board Having Composite Electronic Component

Figure 11:
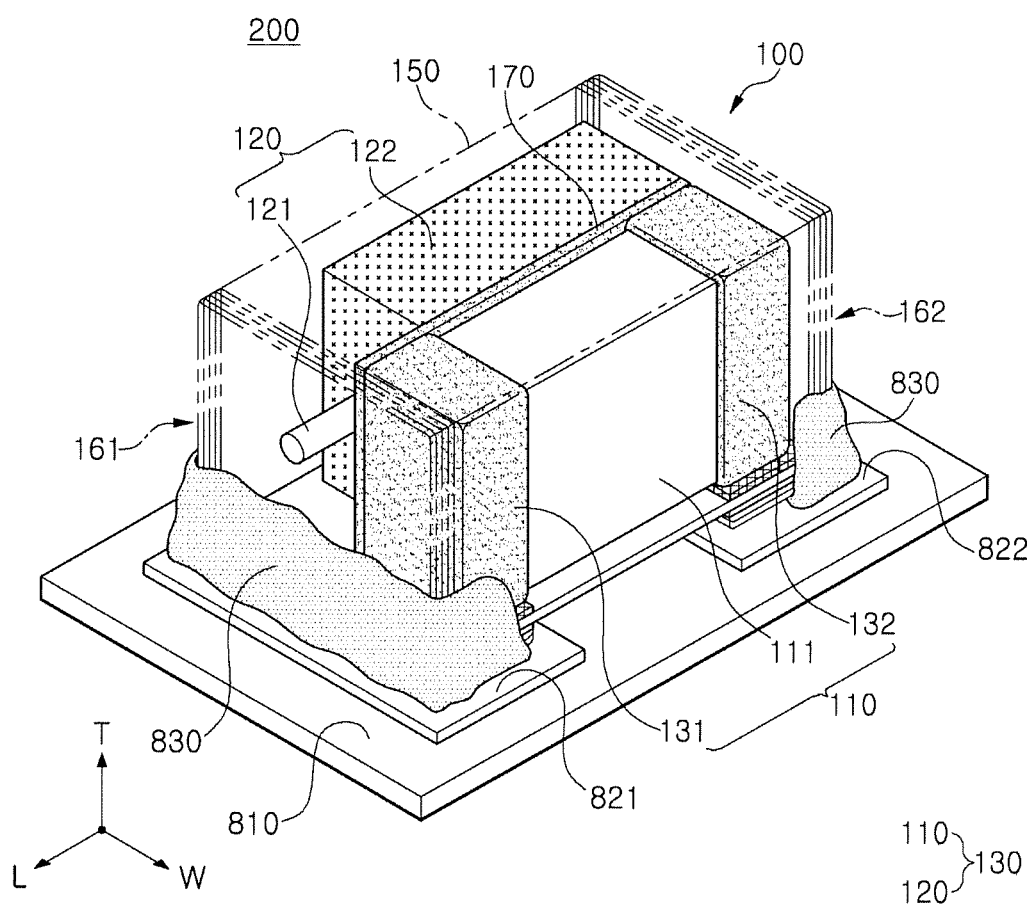
FIG. 11 is a perspective view illustrating a manner in which the composite electronic component of FIG. 1 is mounted on a printed circuit board.

FIG. 11 is a perspective view illustrating a manner in which the composite electronic component of FIG. 1 is mounted on a printed circuit board.

Referring to FIG. 11, a board 200 having a composite electronic component according to another exemplary embodiment in the present disclosure may include a printed circuit board 810 having electrode pads 821 and 822 formed thereon, the composite electronic component 100 mounted on the printed circuit board 810, and solders 830 connecting the electrode pads 821 and 822 and the composite electronic component 100 to each other.

The board 200 having a composite electronic component according to the exemplary embodiment in the present disclosure may include the printed circuit board 810 on which the composite electronic component 100 is mounted and two or more electrode pads 821 and 822 formed on an upper surface of the printed circuit board 810.

The electrode pads (821 and 822) may include first and second electrode pads 821 and 822 connected to the anode terminal 161 and the cathode terminal 162 of the composite electronic component, respectively.

In this case, the anode and cathode terminals 161 and 162 of the composite electronic component may be electrically connected to the printed circuit board 810 by the solder 830 in a state in which the anode and cathode terminals 161 and 162 are positioned on the first and second electrode pads 821 and 822, respectively, so as to contact each other.

As set forth above, according to exemplary embodiments of the present disclosure, the composite electronic component having a high degree of effectiveness in decreasing acoustic noise may be provided.

In addition, the composite electronic component capable of implementing high capacitance and having low equivalent series resistance (ESR), equivalent series inductance (ESL), improved DC-bias characteristics, and a reduced chip thickness may be provided.

While exemplary embodiments have been shown and described above, it will be apparent to those skilled in the art that modifications and variations could be made without departing from the scope of the present invention as defined by the appended claims.

What is claimed is:

1. A composite electronic component comprising:
   an insulation sheet;
   a tantalum capacitor including a body part containing a sintered tantalum powder and a tantalum wire, a portion of which is embedded in the body part, and disposed on the insulation sheet;
   a multilayer ceramic capacitor including a ceramic body including a plurality of dielectric layers, first and second internal electrodes disposed in the ceramic body to face each other with a respective dielectric layer interposed between the first and second internal electrodes, and first and second external electrodes disposed on external surfaces of the ceramic body to be connected to the first and second internal electrodes, respectively, and disposed on the insulation sheet;
   a molded portion enclosing the tantalum capacitor and the multilayer ceramic capacitor;
   an anode terminal disposed on a first end surface of the molded portion in the length direction and a lower surface of the molding portion;
   a cathode terminal disposed on a second end surface of the molded portion in the length direction and the lower surface of the molding portion;
   a first connective conductor part disposed on an upper surface of the insulation sheet and electrically connecting the anode terminal and the first external electrode to each other;
   a second connective conductor part disposed on the upper surface of the insulation sheet and electrically connecting the body part and the cathode terminal to each other; and
   a third connective conductor part disposed on the upper surface of the insulation sheet and electrically connecting the second external electrode and the cathode terminal to each other,
   wherein the tantalum wire is exposed to the first end surface of the molded portion in the length direction, and the tantalum wire is directly connected to the anode terminal, and
   wherein the first internal electrode includes a first lead portion led out to upper and lower surfaces of the ceramic body and a first end surface of the ceramic body in a length direction of the ceramic body, and the second internal electrode includes a second lead portion led out to the upper and lower surfaces of the ceramic body and a second end surface of the ceramic body in the length direction.

2. The composite electronic component of claim 1, wherein the first and second internal electrodes are disposed perpendicularly with respect to the lower surface of the ceramic body.

3. The composite electronic component of claim 1, wherein the first internal electrode includes a first non-pattern portion formed in at least one or more of a first corner portion adjacent to the upper surface and the first end surface of the ceramic body and a second corner portion adjacent to the lower surface and the first end surface of the ceramic body.

4. The composite electronic component of claim 1, wherein the second internal electrode includes a second non-pattern portion formed in at least one or more of a third corner portion adjacent to the upper surface and the second end surface of the ceramic body and a fourth corner portion adjacent to the lower surface and the second end surface of the ceramic body.

5. The composite electronic component of claim 1, wherein the first and second internal electrodes are not formed in corner portions of the ceramic body.

6. The composite electronic component of claim 1, wherein the anode terminal and the cathode terminal respectively include a lower base layer, a side base layer connected to the lower base layer, and a plating layer enclosing the lower base layer and the side base layer.

7. The composite electronic component of claim 6, wherein the lower base layer is formed by etching.

8. The composite electronic component of claim 6, wherein the side base layer is formed by deposition.

9. The composite electronic component of claim 1, wherein in an equivalent series resistance (ESR) vs. input signal frequency graph, an inflection point of equivalent series resistance (ESR) in the composite electronic component is generated in at least one region of frequency regions lower or higher than a self resonant frequency (SRF).

10. The composite electronic component of claim 1, wherein a coupling surface between the multilayer ceramic capacitor and the tantalum capacitor includes an insulation layer disposed on the coupling surface.

11. The composite electronic component of claim 1, wherein the first, second and third connective conductor parts include a metal pad.

12. The composite electronic component of claim 1, wherein the first, second and third connective conductor parts contain a conductive resin.

13. The composite electronic component of claim 1, wherein a volume ratio of the tantalum capacitor and the multilayer ceramic capacitor is 2:8 to 9:1 (tantalum capacitor: multilayer ceramic capacitor).

14. A board having a composite electronic component comprising:
a printed circuit board on which electrode pads are formed;
the composite electronic component mounted on the printed circuit board; and
a solder connecting the electrode pads and the composite electronic component to each other,
wherein the composite electronic component includes: an insulation sheet; a tantalum capacitor including a body part containing a sintered tantalum powder and a tantalum wire, a portion of which is embedded in the body part, and disposed on the insulation sheet; a multilayer ceramic capacitor including a ceramic body including a plurality of dielectric layers, first and second internal electrodes disposed in the ceramic body to face each other with a respective dielectric layer interposed between the first and second internal electrodes, and first and second external electrodes disposed on external surfaces of the ceramic body to be connected to the first and second internal electrodes, respectively, and disposed on the insulation sheet; a molded portion enclosing the tantalum capacitor and the multilayer ceramic capacitor; an anode terminal disposed on a first end surface of the molded portion in the length direction and a lower surface of the molding portion; a cathode terminal disposed on a second end surface of the molded portion in the length direction and the lower surface of the molding portion; a first connective conductor part disposed on an upper surface of the insulation sheet and electrically connecting the anode terminal and the first external electrode to each other; a second connective conductor part disposed on the upper surface of the insulation sheet and electrically connecting the body part and the cathode terminal to each other; and a third connective conductor part disposed on the upper surface of the insulation sheet and electrically connecting the second external electrode and the cathode terminal to each other,
wherein the tantalum wire is exposed to the first end surface of the molded portion in the length direction, and the tantalum wire is directly connected to the anode terminal,
the first internal electrode including a first lead portion led out to upper and lower surfaces of the ceramic body and a first end surface of the ceramic body in a length direction of the ceramic body, and the second internal electrode including a second lead portion led out to the upper and lower surfaces of the ceramic body and a second end surface of the ceramic body in the length direction.

15. The board having a composite electronic component of claim 14, wherein the first and second internal electrodes are disposed perpendicularly with respect to the lower surface of the ceramic body.

16. The composite electronic component of claim 1, wherein the first, second and third connective conductor parts are disposed directly on the upper surface of the insulation sheet.

17. The board having a composite electronic component of claim 14, wherein the first, second and third connective conductor parts are disposed directly on the upper surface of the insulation sheet.

18. The composite electronic component of claim 16, wherein the body part is disposed directly on the second connective conductor part.

19. The board having a composite electronic component of claim 17, wherein the body part is disposed directly on the second connective conductor part.

* * * * *